United States Patent
Wei et al.

(10) Patent No.: US 8,865,577 B2
(45) Date of Patent: Oct. 21, 2014

(54) METHOD FOR MAKING EPITAXIAL STRUCTURE

(71) Applicants: Yang Wei, Beijing (CN); Shou-Shan Fan, Beijing (CN)

(72) Inventors: Yang Wei, Beijing (CN); Shou-Shan Fan, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/676,033

(22) Filed: Nov. 13, 2012

(65) Prior Publication Data

US 2013/0288458 A1    Oct. 31, 2013

(30) Foreign Application Priority Data

Apr. 25, 2012  (CN) .......................... 2012 1 0122531

(51) Int. Cl.
   *H01L 21/20*      (2006.01)
(52) U.S. Cl.
   USPC ...................... 438/481; 977/734; 257/E21.09
(58) Field of Classification Search
   USPC .......................................... 438/481, 503, 507
   See application file for complete search history.

(56) References Cited

U.S. PATENT DOCUMENTS

| | | | | |
|---|---|---|---|---|
| 5,665,218 A | * | 9/1997 | Ashizawa et al. | 205/171 |
| 6,350,389 B1 | * | 2/2002 | Fujishima et al. | 216/56 |
| 6,860,943 B2 | * | 3/2005 | Koike et al. | 117/102 |
| 6,924,159 B2 | * | 8/2005 | Usui et al. | 438/22 |
| 7,154,128 B2 | * | 12/2006 | Kiyoku et al. | 257/103 |
| 2006/0189017 A1 | * | 8/2006 | Nogami | 438/46 |
| 2008/0242785 A1 | * | 10/2008 | Ma et al. | 524/413 |
| 2012/0058397 A1 | * | 3/2012 | Zhamu et al. | 429/231.8 |
| 2012/0175606 A1 | * | 7/2012 | Wei et al. | 257/43 |
| 2012/0181507 A1 | * | 7/2012 | Dimitrakopoulos et al. | 257/29 |

FOREIGN PATENT DOCUMENTS

CN           101503174        *   9/2009   ............... B82B 3/00

* cited by examiner

*Primary Examiner* — Reema Patel
(74) *Attorney, Agent, or Firm* — Novak Druce Connolly Bove + Quigg LLP

(57) ABSTRACT

A method for making epitaxial structure is provided. The method includes providing a substrate having an epitaxial growth surface, growing a buffer layer on the epitaxial growth surface; placing a graphene layer on the buffer layer; epitaxially growing an epitaxial layer on the buffer layer; and removing the substrate. The graphene layer includes a number of apertures to expose a part of the buffer layer. The epitaxial layer is grown from the exposed part of the buffer layer and through the apertures.

19 Claims, 16 Drawing Sheets

METHOD FOR MAKING EPITAXIAL STRUCTURE

CROSS-REFERENCE TO RELATED APPLICATIONS

This application claims all benefits accruing under 35 U.S.C. §119 from China Patent Applications: Application No. 201210122531.9, filed on Apr. 25, 2012 in the China Intellectual Property Office, disclosures of which are incorporated herein by references.

BACKGROUND

1. Technical Field

The present disclosure relates to epitaxial structures and methods for making the same.

2. Description of Related Art

Light emitting devices such as light emitting diodes (LEDs) based on group III-V nitride semiconductors such as gallium nitride (GaN) have been put into practice.

Since wide GaN substrate cannot be produced, the LEDs have been produced on a heteroepitaxial substrate such as sapphire. The use of sapphire substrate is problematic due to lattice mismatch and thermal expansion mismatch between GaN and the sapphire substrate. One consequence of thermal expansion mismatch is bowing of the GaN/sapphire substrate structure, which leads to cracking and difficulty in fabricating devices with small feature sizes. A solution for this is to form a plurality of grooves on the surface of the sapphire substrate by lithography or etching before growing the GaN layer. However, the process of lithography and etching is complex, high in cost, and will pollute the sapphire substrate.

What is needed, therefore, is to provide a method for solving the problem discussed above.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

References will now be made to the drawings to describe, in detail, various embodiments of the present epitaxial structures and methods for making the same.

Figure 1:
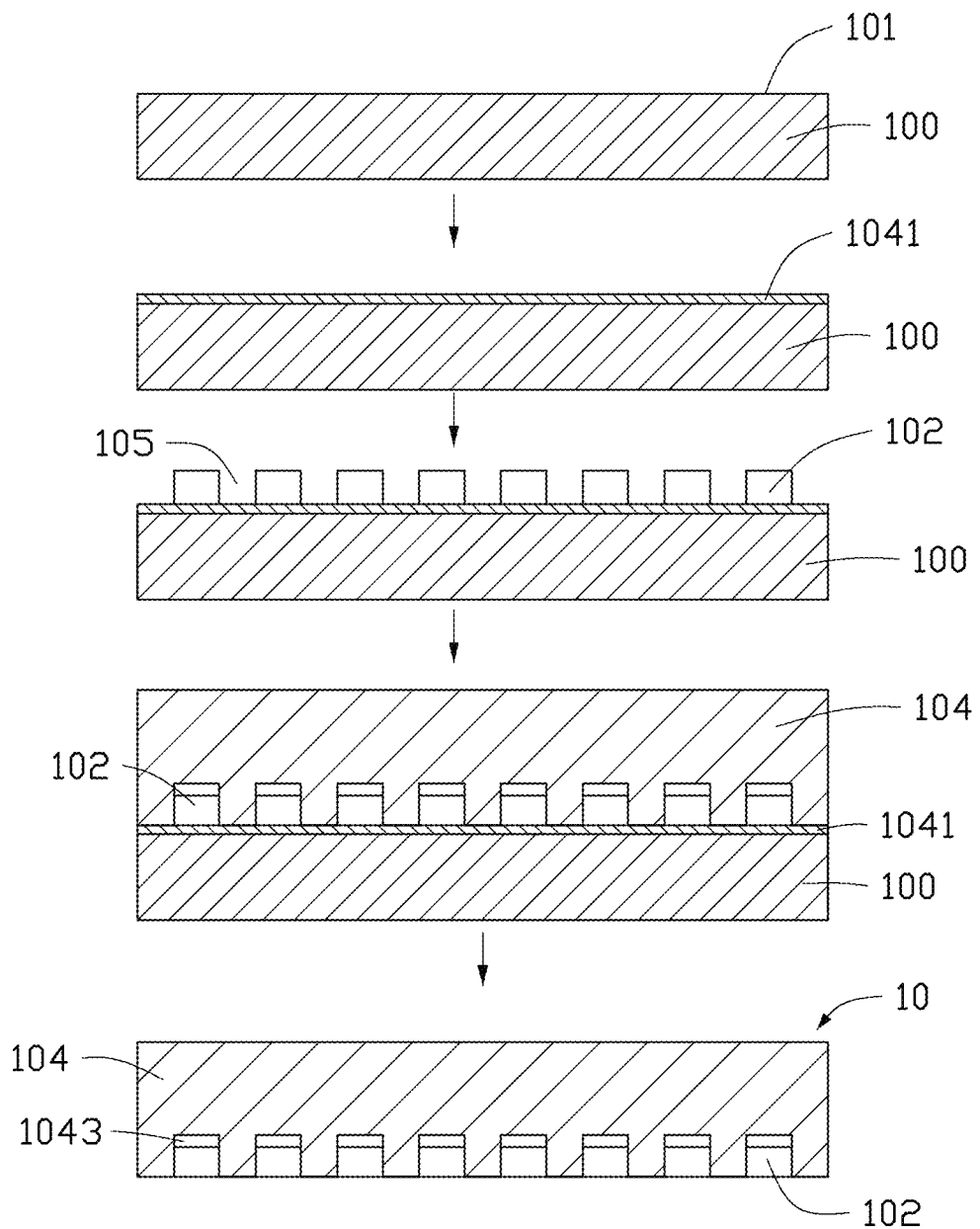
FIG. 1 is a flowchart of one embodiment of a method for making an epitaxial structure.

Referring to FIG. 1, a method for making an epitaxial structure 10 of one embodiment includes the following steps:

step (10), providing a substrate 100 having an epitaxial growth surface 101;

step (20), growing a buffer layer 1041 on the epitaxial growth surface 101;

step (30), placing a graphene layer 102 on the buffer layer 1041;

step (40), epitaxially growing an epitaxial layer 104 on the buffer layer 1041; and step (50), removing the substrate 100.

In step (10), the epitaxial growth surface 101 can be used to grow the epitaxial layer 104. The epitaxial growth surface 101 is a clean and smooth surface. The substrate 100 can be a single-layer structure or a multi-layer structure. If the substrate 100 is a single-layer structure, the substrate 100 can be a single crystal structure having a crystal face used as the epitaxial growth surface 101. If the substrate 100 is a multi-layer structure, the substrate 100 should include at least one layer having the crystal face. The material of the substrate 100 can be GaAs, GaN, AlN, Si, SOI (silicon on insulator), SiC, MgO, ZnO, LiGaO$_2$, LiAlO$_2$, or Al$_2$O$_3$. The material of the substrate 100 can be selected according to the material of the epitaxial layer 104. The epitaxial layer 104 and the substrate 100 should have a small lattice mismatch and a thermal expansion mismatch. The size, thickness, and shape of the substrate 100 can be selected according to need. In one embodiment, the substrate 100 is a sapphire substrate.

In step (20), the buffer layer 1041 can be grown by a method such as molecular beam epitaxy, chemical beam epitaxy, reduced pressure epitaxy, low temperature epitaxy, select epitaxy, liquid phase deposition epitaxy, metal organic vapor phase epitaxy, ultra-high vacuum chemical vapor deposition, hydride vapor phase epitaxy, or metal organic chemical vapor deposition (MOCVD). The thickness of the buffer layer 1041 can be in a range from about 10 nanometers to about 50 nanometers. The material of the buffer layer 1041 can be selected according to the material of the epitaxial layer 104 and the substrate 100 so that the lattice mismatch between the epitaxial layer 104 and the substrate 100 can be reduced. The material of the buffer layer 1041 can be GaN, SiC, TiN or AlN.

In one embodiment, the material of the buffer layer 1041 is GaN. The buffer layer 1041 is grown on a sapphire substrate 100 by MOCVD method. The nitrogen source gas is high-purity ammonia ($NH_3$), the Ga source gas is trimethyl gallium (TMGa) or triethyl gallium (TEGa), and the carrier gas is hydrogen ($H_2$). The growth of the buffer layer 1041 includes the following steps:

step (201), locating the sapphire substrate 100 into a reaction chamber, heating the sapphire substrate 100 to about 1100° C. to about 1200° C., introducing the carrier gas, and baking the sapphire substrate 100 for about 200 seconds to about 1000 seconds;

step (202), growing a low-temperature GaN buffer layer 1041 with a thickness of about 30 nanometers by cooling down the temperature of the reaction chamber to a range from about 500° C. to 650° C. in the carrier gas atmosphere, and introducing the Ga source gas and the nitrogen source gas at the same time.

In step (30), the graphene layer 102 can include graphene powders or at least one graphene film. The graphene powders include a plurality of dispersed graphene grains. The graphene film, namely a single-layer graphene, is a single layer of continuous carbon atoms. The single-layer graphene is a nanometer-thick two-dimensional analog of fullerenes and carbon nanotubes. When the graphene layer 102 includes graphene powders, the graphene powders can be formed into a patterned structure by the process of dispersion, coating and etching. When the graphene layer 102 includes the at least one graphene film, a plurality of graphene films can be stacked on each other or arranged coplanar side by side. The graphene film can be patterned by cutting or etching. The thickness of the graphene layer 102 can be in a range from about 1 nanometer to about 100 micrometers. For example, the thickness of the graphene layer 102 can be 1 nanometer, 10 nanometers, 200 nanometers, 1 micrometer, or 10 micrometers. The single-layer graphene can have a thickness of a single carbon atom. In one embodiment, the graphene layer 102 is a pure graphene structure consisting of graphene.

The single-layer graphene has very unique properties. The single-layer graphene is almost completely transparent. The single-layer graphene absorbs only about 2.3% of visible light and allows most of the infrared light to pass through. The thickness of the single-layer graphene is only about 0.34 nanometers. A theoretical specific surface area of the single-layer grapheme is 2630 $m^2 \cdot g^{-1}$. The tensile strength of the single-layer graphene is 125 GPa, and the Young's modulus of the single-layer graphene can be as high as 1.0 TPa. The thermal conductivity of the single-layer graphene is measured at 5300 $W \cdot m^{-1} \cdot K^{-1}$. A theoretical carrier mobility of the single-layer graphene is $2 \times 10^5$ $cm^2 \cdot V^{-1} \cdot s^{-1}$. A resistivity of the single-layer graphene is $1 \times 10^{-6}$ $\Omega \cdot cm$ which is about ⅔ of a resistivity of copper. Phenomenon of quantum Hall effects and scattering-free transmissions can be observed on the single-layer grapheme at room temperature.

Figure 2:
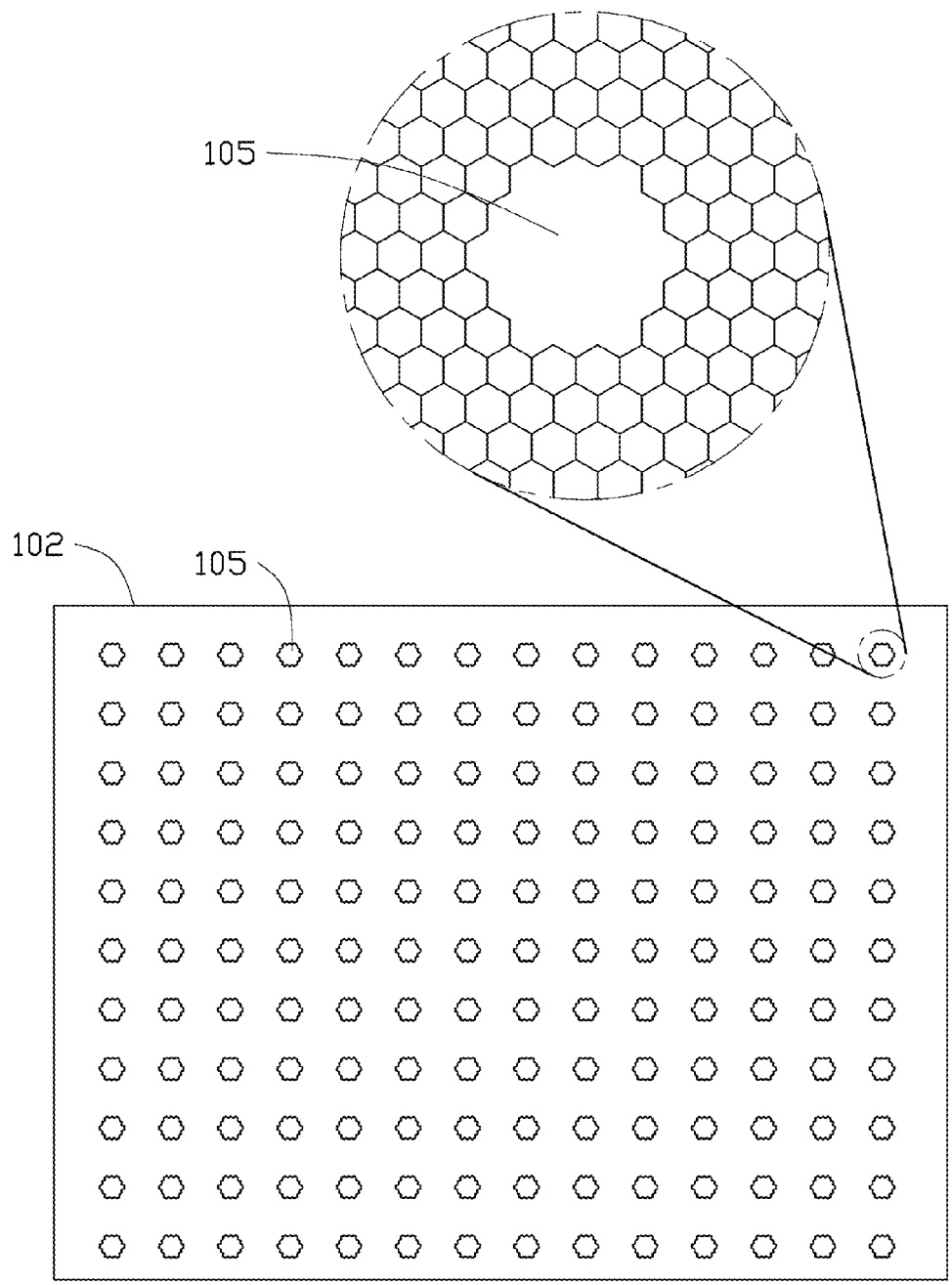
FIG. 2 is a schematic view of one embodiment of a graphene layer having a plurality of hole shaped apertures.
Figure 3:
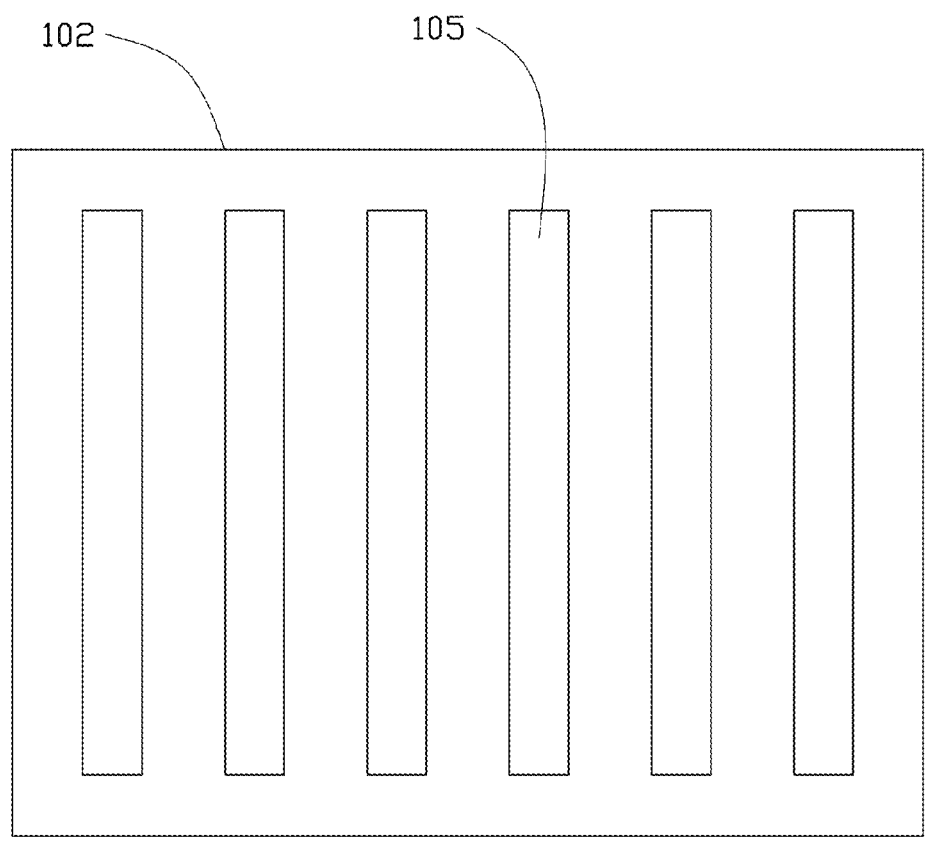
FIG. 3 is a schematic view of one embodiment of a graphene layer having a plurality of rectangular shaped apertures.
Figure 4:
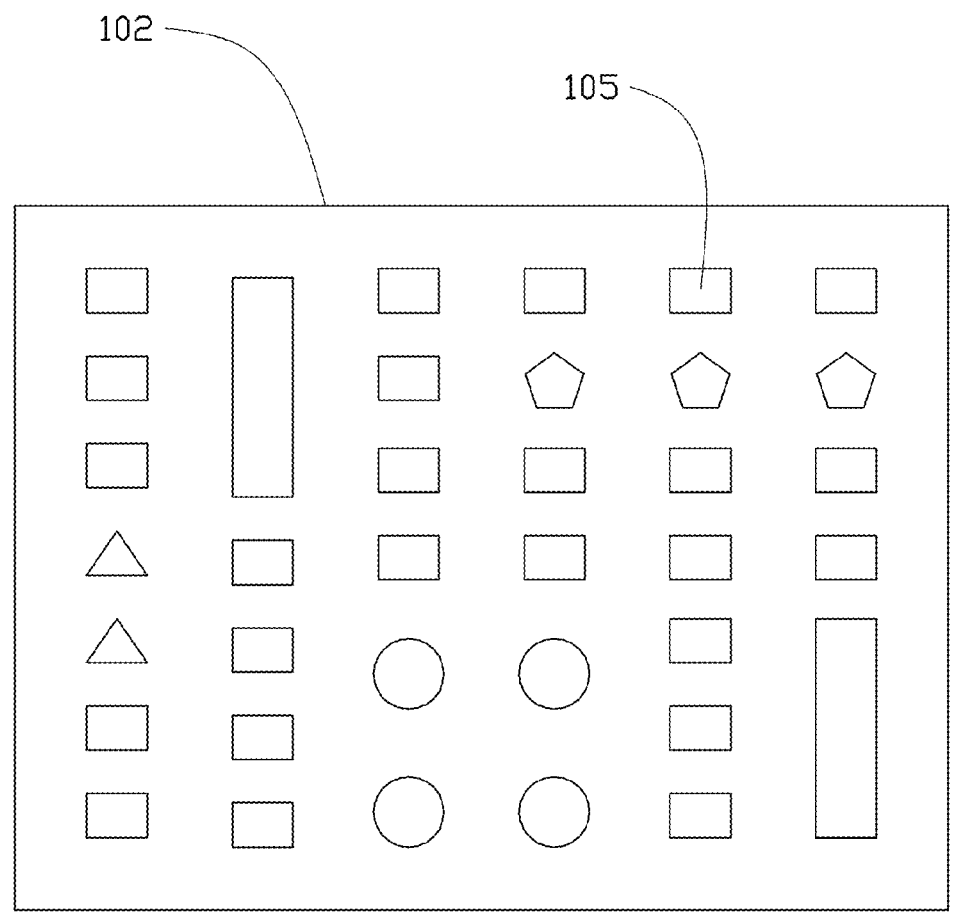
FIG. 4 is a schematic view of one embodiment of a graphene layer having a plurality of apertures in different shapes.

In one embodiment, the graphene layer 102 is a patterned structure. As shown in FIGS. 2-4, the term "patterned structure" means the graphene layer 102 is a continuous structure and defines a plurality of apertures 105. When the graphene layer 102 is located on the buffer layer 1041, part of the buffer layer 1041 is exposed from the apertures 105 to grow the epitaxial layer 104.

The shape of the aperture 105 is not limited and can be round, square, triangular, diamond or rectangular. The graphene layer 102 can have the apertures 105 of all the same shape or of different shapes. The apertures 105 can be dispersed uniformly on the grapheme layer 102. Each of the apertures 105 extends through the graphene layer 102 along the thickness direction. The apertures 105 can be hole shaped as shown in FIG. 2 or rectangular shaped as shown in FIG. 3. Alternatively, the apertures 105 can be a mixture of hole shaped and rectangular shaped in the patterned graphene layer 102, as shown in FIG. 4. Hereafter, the size of the aperture 105 is the diameter of the hole or width of the rectangular. The sizes of the apertures 105 can be different. The average size of the apertures 105 can be in a range from about 10 nanometers to about 500 micrometers. For example, the sizes of the apertures 105 can be about 50 nanometers, 100 nanometers, 500 nanometers, 1 micrometer, 10 micrometers, 80 micrometers, or 120 micrometers. The smaller the sizes of the apertures 105, the less dislocation defects will occur during the process of growing the epitaxial layer 104. In one embodiment, the sizes of the apertures 105 are in a range from about 10 nanometers to about 10 micrometers. A dutyfactor of the graphene layer 102 is an area ratio between the sheltered buffer layer 1041 and the exposed buffer layer 1041. The dutyfactor of the graphene layer 102 can be in a range from about 1:100 to about 100:1. For example, the dutyfactor of the graphene layer 102 can be about 1:10, 1:2, 1:4, 4:1, 2:1, or 10:1. In one embodiment, the dutyfactor of the graphene layer 102 is in a range from about 1:4 to about 4:1.

Figure 5:
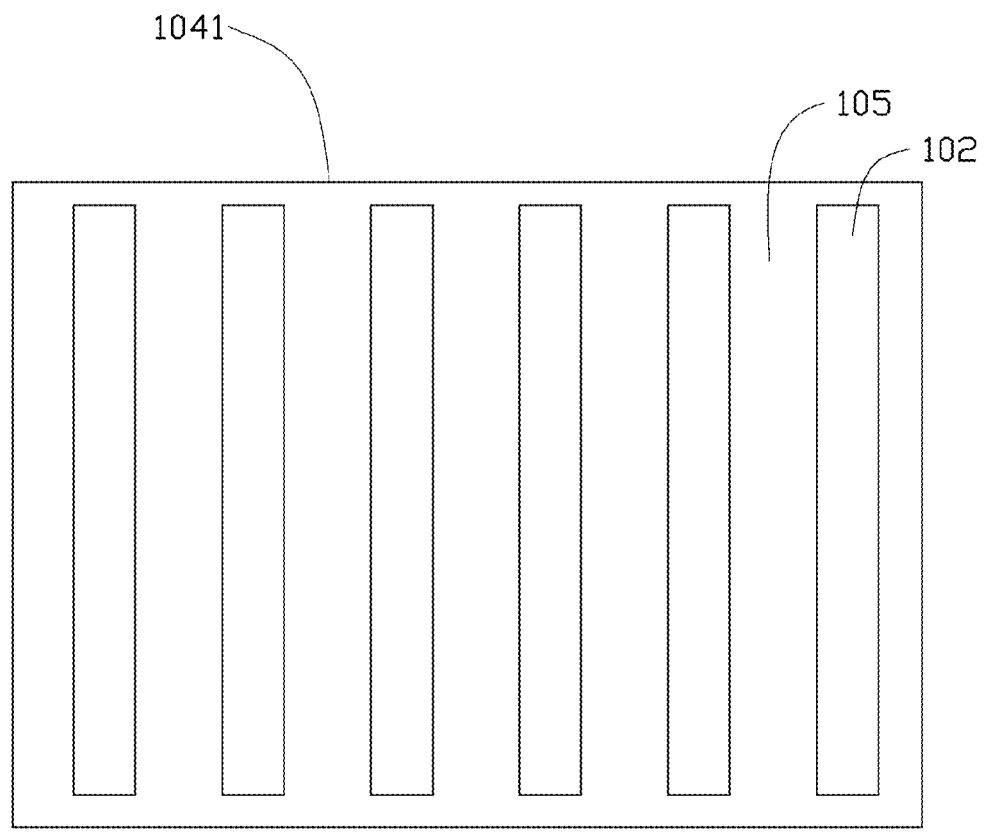
FIG. 5 is a schematic view of one embodiment of a plurality of patterned graphene layers spaced from each other.

As shown in FIG. 5, the term "patterned structure" can also be a plurality of patterned graphene layers spaced from each other. The aperture 105 is defined between adjacent two of the patterned graphene layers. When the graphene layer 102 is located on the buffer layer 1041, part of the buffer layer 1041 is exposed from the aperture 105 to grow the epitaxial layer 104. In one embodiment, the graphene layer 102 includes a plurality of graphene strips placed in parallel with each other and spaced from each other as shown in FIG. 5.

The graphene layer 102 can be grown on the buffer layer 1041 directly, by transfer printing a preformed graphene film, or by filtering and depositing a graphene suspension with graphene powders dispersed therein. The graphene film can be made by chemical vapor deposition, exfoliating graphite, electrostatic deposition, pyrolysis of silicon carbide, epitaxial growth on silicon carbide, or epitaxial growth on metal substrates. The graphene powders can be made by graphite oxide reduction, pyrolysis of sodium ethoxide, cutting carbon nanotube, carbon dioxide reduction method, or sonicating graphite.

In one embodiment, the graphene layer 102 of FIG. 2 can be made by following steps:

step (301), providing a graphene film;

step (302), transferring the graphene film on the buffer layer 1041; and step (303), patterning the graphene film.

In step (301), the graphene film is made by chemical vapor deposition which includes the steps of: (a1) providing a substrate; (b1) depositing a metal catalyst layer on the substrate; (c1) annealing the metal catalyst layer; and (d1) growing the graphene film in a carbon source gas.

In step (a1), the substrate can be a copper foil or a $Si/SiO_2$ wafer. The $Si/SiO_2$ wafer can have a Si layer with a thickness in a range from about 300 micrometers to about 1000 micrometers and a $SiO_2$ layer with a thickness in a range from about 100 nanometers to about 500 nanometers. In one embodiment, the $Si/SiO_2$ wafer has a Si layer with a thickness of about 600 micrometers and a $SiO_2$ layer with a thickness of about 300 nanometers.

In step (b1), the metal catalyst layer can be made of nickel, iron, or gold. The thickness of the metal catalyst layer can be in a range from about 100 nanometers to about 800 nanometers. The metal catalyst layer can be made by chemical vapor deposition, physical vapor deposition, such as magnetron sputtering or electron beam deposition. In one embodiment, a metal nickel layer of about 500 nanometers is deposited on the $SiO_2$ layer.

In step (c1), the annealing temperature can be in a range from about 900° C. to about 1000° C. The annealing can be performed in a mixture of argon gas and hydrogen gas. The flow rate of the argon gas is about 600 sccm, and the flow rate of the hydrogen gas is about 500 sccm. The annealing time is in a range from about 10 minutes to about 20 minutes.

In step (d1), the growth temperature is in a range from about 900° C. to about 1000° C. The carbon source gas is methane. The growth time is in a range from about 5 minutes to about 10 minutes.

In step (302), the transferring the graphene film includes the steps of: (a2) coating an organic colloid or polymer on the surface of the graphene film as a supporter; (b2) baking the organic colloid or polymer on the graphene film; (c2) immersing the baked graphene film with the $Si/SiO_2$ substrate in deionized water so that the metal catalyst layer and the $SiO_2$ layer are separated to obtain a supporter/graphene film/metal catalyst layer composite; (d2) removing the metal catalyst layer from the supporter/graphene film/metal catalyst layer composite to obtain a supporter/graphene film composite; (e2) placing the supporter/graphene film composite on the buffer layer 1041; (f2) fixing the graphene film on the buffer layer 1041 firmly by heating; and (g2) removing the supporter.

In step (a2), the supporter material is poly (methyl methacrylate) (PMMA), polydimethylsiloxane, positive photoresist 9912, or photoresist AZ5206.

In step (b2), the baking temperature is in a range from about 100° C. to about 185° C.

In step (c2), an ultrasonic treatment on the metal catalyst layer and the $SiO_2$ layer can be performed after being immersed in deionized water.

In step (d2), the metal catalyst layer is removed by chemical liquid corrosion. The chemical liquid can be nitric acid, hydrochloric acid, ferric chloride ($FeCl_3$), and ferric nitrate ($Fe(NO_3)_3$).

In step (g2), the supporter is removed by soaking the supporter in acetone and ethanol first, and then heating the supporter to about 400° C. in a protective gas.

In step (303), the method of patterning the graphene film can be photocatalytic titanium oxide cutting, ion beam etching, atomic force microscope etching, or the plasma etching. In one embodiment, an anodic aluminum oxide mask is placed on the surface of the graphene film, and then the graphene film is etched by plasma. The anodic aluminum oxide mask has a plurality of micropores arranged in an array. The part of the graphene film corresponding to the micropores of the anodic aluminum oxide mask may be removed by the plasma etching, thereby obtaining a graphene layer 102 having a plurality of apertures.

In one embodiment, the graphene layer 102 of FIG. 5 can be made by following steps:
step (304), making a graphene suspension with graphene powder dispersed therein;
step (305), forming a continuous graphene coating on the buffer layer 1041; and
step (306), patterning the continuous graphene coating.

In step (304), the powder is dispersed in a solvent such as water, ethanol, N-methyl pyrrolidone, tetrahydrofuran, or 2-nitrogen dimethylacetamide. The graphene powder can be made by graphite oxide reduction, pyrolysis of sodium ethoxide, cutting carbon nanotube, carbon dioxide reduction method, or sonicating graphite. The concentration of the suspension can be in a range from about 1 mg/ml to about 3 mg/ml.

In step (305), the suspension can be coated on the buffer layer 1041 by spinning coating. The rotating speed of spinning coating can be in a range from about 3000 r/min to about 5000 r/min The time for spinning coating can be in a range from about 1 minute to about 2 minutes.

In step (306), the method of patterning the continuous graphene coating can be photocatalytic titanium oxide cutting, ion beam etching, atomic force microscope etching, or the plasma etching.

In one embodiment, photocatalytic titanium oxide cutting is used to pattern the continuous graphene coating. The method includes following steps:
step (3061), making a patterned metal titanium layer;
step (3062), heating and oxidizing the patterned metal titanium layer to obtain a patterned titanium dioxide layer;
step (3063), contacting the patterned titanium dioxide layer with the continuous graphene coating;
step (3064), irradiating the patterned titanium dioxide layer with ultraviolet light; and
step (3065), removing the patterned titanium dioxide layer.

In step (3061), the patterned metal titanium layer can be formed by vapor deposition through a mask or photolithography on a surface of a quartz substrate. The thickness of the quartz substrate can be in a range from about 300 micrometers to about 1000 micrometers. The thickness of the metal titanium layer can be in a range from about 3 nanometers to about 10 nanometers. In one embodiment, the quartz substrate has a thickness of 500 micrometers, and the metal titanium layer has a thickness of 4 nanometers. The patterned metal titanium layer is a continuous titanium layer having a plurality of spaced stripe-shaped openings.

In step (3062), the patterned metal titanium layer is heated under conditions of about 500° C. to about 600° C. for about 1 hour to about 2 hours. The heating can be performed in a furnace.

In step (3064), the ultraviolet light has a wavelength of about 200 nanometers to about 500 nanometers. The patterned titanium dioxide layer is irradiated by the ultraviolet light in air or oxygen atmosphere with a humidity of about 40% to about 75%.

The irradiating time is about 30 minutes to about 90 minutes. Because the titanium dioxide is a semiconductor material with photocatalytic property, the titanium dioxide can produce electrons and holes under ultraviolet light irradiation. The electrons will be captured by the Ti (IV) of the titanium surface, and the holes will be captured by the lattice oxygen. Thus, the titanium dioxide has strong oxidation-reduction ability. The captured electrons and holes are easy to oxidize and reduce the water vapor in the air to produce active substance such as $O_2$ and $H_2O_2$. The active substance can decompose the graphene material easily.

In step (3065), the patterned titanium dioxide layer can be removed by removing the quartz substrate. After removing the patterned titanium dioxide layer, the patterned graphene layer 102 can be obtained. The pattern of the patterned graphene layer 102 and the pattern of the patterned titanium dioxide layer are mutually engaged with each other. Namely, the part of the continuous graphene coating corresponding to the patterned titanium dioxide layer will be removed off.

In other embodiment, in step (3061), the patterned metal titanium layer can be formed by depositing titanium on a patterned carbon nanotube structure directly. The carbon nanotube structure can be a carbon nanotube film or a plurality of carbon nanotube wires. The plurality of carbon nanotube wires can be crossed or weaved together to form a carbon nanotube structure. The plurality of carbon nanotube wires can also be arranged in parallel and spaced from each other to form a carbon nanotube structure. Because a plurality of apertures is formed in the carbon nanotube film or between the carbon nanotube wires, the carbon nanotube structure can be patterned. The titanium deposited on the patterned carbon nanotube structure can form a patterned titanium layer. In step (3062), the patterned titanium layer can be heated by applying an electric current through the patterned carbon nanotube structure. In step (3064), the part of the continuous graphene coating corresponding to the patterned carbon nanotube structure will be removed off to form a plurality of apertures 105. Because the diameter of the carbon nanotube is about 0.5 nanometers to about 50 nanometers, the size of the apertures 105 can be several nanometers to tens nanometers. The size of the apertures 105 can be controlled by selecting the diameter of the carbon nanotube.

The carbon nanotube structure is a free-standing structure. The term "free-standing structure" means that the carbon nanotube structure can sustain the weight of itself when it is hoisted by a portion thereof without any significant damage to its structural integrity. That is, the carbon nanotube structure can be suspended by two spaced supports. Thus, the process of patterning the continuous graphene coating can be operated as follows. For example, first, depositing titanium layer on a plurality of parallel carbon nanotube wires; second, heating and oxidizing the titanium layer on the plurality of carbon nanotube wires form titanium dioxide layer; third, arranging the plurality of carbon nanotube wires on the continuous graphene coating; fourth, irradiating the plurality of carbon nanotube wires with the ultraviolet light; last removing the plurality of carbon nanotube wires to obtain a graphene layer 102 having a plurality of rectangular shaped apertures 105.

Figure 6:
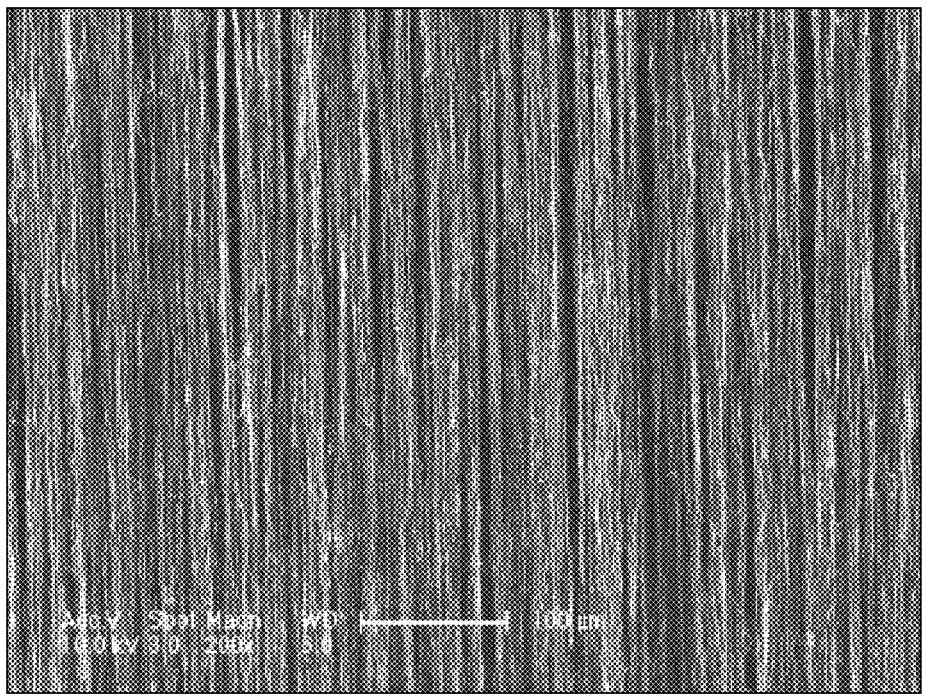
FIG. 6 is a Scanning Electron Microscope (SEM) image of a drawn carbon nanotube film.
Figure 7:
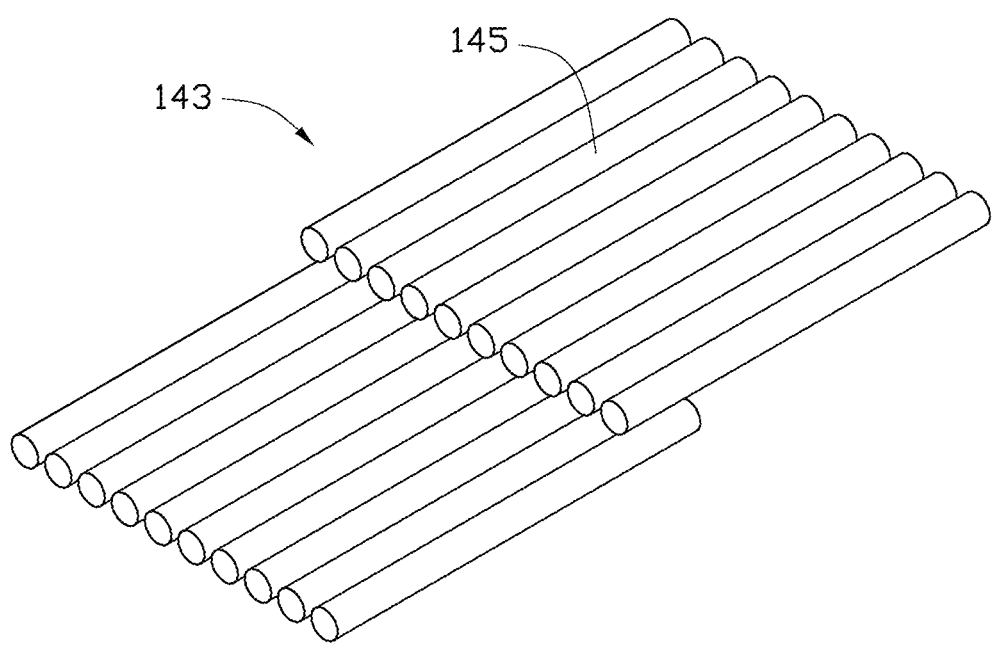
FIG. 7 is a schematic structural view of a carbon nanotube segment of the drawn carbon nanotube film of FIG. 6.

In one embodiment, the carbon nanotube structure includes at least one drawn carbon nanotube film. A drawn carbon nanotube film can be drawn from a carbon nanotube array that is able to have a film drawn therefrom. The drawn carbon nanotube film includes a plurality of successive and oriented carbon nanotubes joined end-to-end by van der Waals attractive force therebetween. The drawn carbon nanotube film is a free-standing film. Referring to FIGS. 6-7, each drawn carbon nanotube film includes a plurality of successively oriented carbon nanotube segments 143 joined end-to-end by van der Waals attractive force therebetween. Each carbon nanotube segment 143 includes a plurality of carbon nanotubes 145 parallel to each other, and combined by van der Waals attractive force therebetween. As can be seen in FIG. 6, some variations can occur in the drawn carbon nanotube film. The carbon nanotubes 145 in the drawn carbon nanotube film are oriented along a preferred orientation. The drawn carbon nanotube film can be treated with an organic solvent to increase the mechanical strength and toughness and reduce the coefficient of friction of the drawn carbon nanotube film. A thickness of the drawn carbon nanotube film can range from about 0.5 nanometers to about 100 micrometers.

Figure 8:
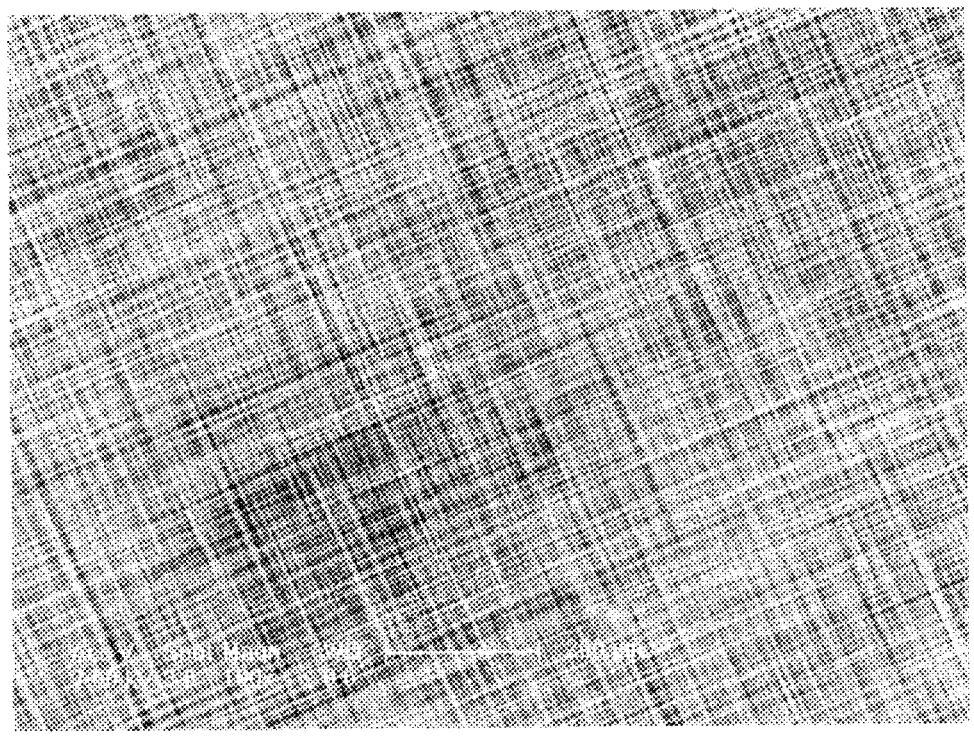
FIG. 8 is an SEM image of cross-stacked drawn carbon nanotube films.

The carbon nanotube structure can include at least two stacked drawn carbon nanotube films. In other embodiments, the carbon nanotube structure can include two or more coplanar carbon nanotube films, and can include layers of coplanar carbon nanotube films. Additionally, when the carbon nanotubes in the carbon nanotube film are aligned along one preferred orientation (e.g., the drawn carbon nanotube film), an angle can exist between the orientation of carbon nanotubes in adjacent films, whether stacked or adjacent. Adjacent carbon nanotube films can be combined by only the van der Waals attractive force therebetween. An angle between the aligned directions of the carbon nanotubes in two adjacent carbon nanotube films can range from about 0 degrees to about 90 degrees. When the angle between the aligned directions of the carbon nanotubes in adjacent stacked drawn carbon nanotube films is larger than 0 degrees, a plurality of micropores is defined by the carbon nanotube structure. Referring to FIG. 8, the carbon nanotube structure is shown with the aligned directions of the carbon nanotubes between adjacent stacked drawn carbon nanotube films at 90 degrees. Stacking the carbon nanotube films will also add to the structural integrity of the carbon nanotube structure.

A step of heating the drawn carbon nanotube film can be performed to decrease the thickness of the drawn carbon nanotube film. The drawn carbon nanotube film can be partially heated by a laser or microwave. The thickness of the drawn carbon nanotube film can be reduced because some of the carbon nanotubes will be oxidized. In one embodiment, the drawn carbon nanotube film is irradiated by a laser device in an atmosphere comprising of oxygen therein. The power density of the laser is greater than $0.1 \times 10^4$ watts per square meter. The drawn carbon nanotube film can be heated by fixing the drawn carbon nanotube film and moving the laser device at a substantially uniform speed to irradiate the drawn carbon nanotube film. When the laser irradiates the drawn carbon nanotube film, the laser is focused on the surface of the drawn carbon nanotube film to form a laser spot. The diameter of the laser spot ranges from about 1 micron to about 5 millimeters. In one embodiment, the laser device is carbon dioxide laser device. The power of the laser device is about 30 watts. The wavelength of the laser is about 10.6 micrometers. The diameter of the laser spot is about 3 millimeters. The velocity of the laser movement is less than 10 millimeters per second. The power density of the laser is $0.053 \times 10^{12}$ watts per square meter.

Figure 9:
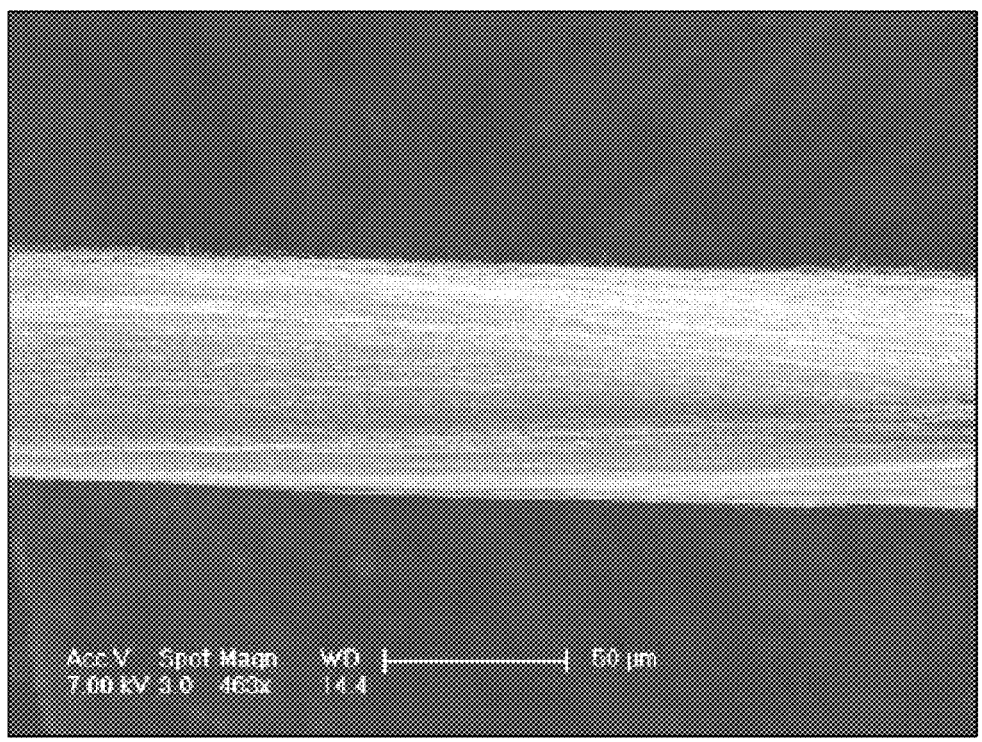
FIG. 9 is an SEM image of an untwisted carbon nanotube wire.

The carbon nanotube wire can be untwisted or twisted. Treating the drawn carbon nanotube film with a volatile organic solvent can form the untwisted carbon nanotube wire. Specifically, the organic solvent is applied to soak the entire surface of the drawn carbon nanotube film. During the soaking, adjacent parallel carbon nanotubes in the drawn carbon nanotube film will bundle together, due to the surface tension of the organic solvent as it volatilizes, and thus, the drawn carbon nanotube film will be shrunk into an untwisted carbon nanotube wire. Referring to FIG. 9, the untwisted carbon nanotube wire includes a plurality of carbon nanotubes substantially oriented along a same direction (i.e., a direction along the length of the untwisted carbon nanotube wire). The carbon nanotubes are substantially parallel to the axis of the untwisted carbon nanotube wire. More specifically, the untwisted carbon nanotube wire includes a plurality of successive carbon nanotube segments joined end to end by van der Waals attractive force therebetween. Each carbon nanotube segment includes a plurality of carbon nanotubes substantially parallel to each other, and combined by van der Waals attractive force therebetween. The carbon nanotube segments can vary in width, thickness, uniformity, and shape. The length of the untwisted carbon nanotube wire can be arbitrarily set as desired. A diameter of the untwisted carbon nanotube wire ranges from about 0.5 nanometers to about 100 micrometers.

Figure 10:
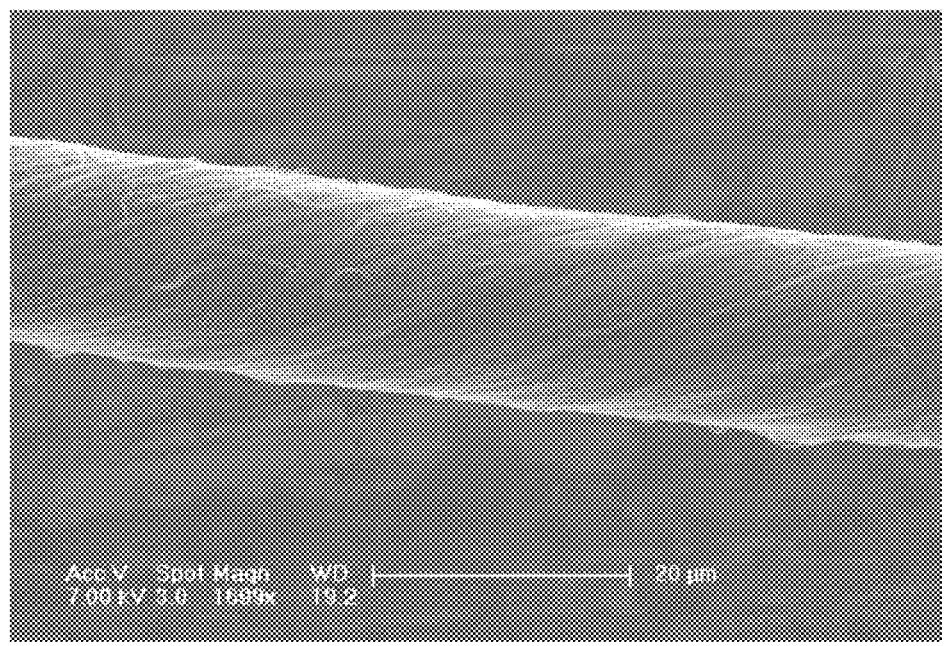
FIG. 10 is an SEM image of a twisted carbon nanotube wire.

The twisted carbon nanotube wire can be formed by twisting a drawn carbon nanotube film using a mechanical force to turn the two ends of the drawn carbon nanotube film in opposite directions. Referring to FIG. 10, the twisted carbon nanotube wire includes a plurality of carbon nanotubes helically oriented around an axial direction of the twisted carbon nanotube wire. More specifically, the twisted carbon nanotube wire includes a plurality of successive carbon nanotube segments joined end to end by van der Waals attractive force therebetween. Each carbon nanotube segment includes a plurality of carbon nanotubes parallel to each other, and combined by van der Waals attractive force therebetween. The length of the carbon nanotube wire can be set as desired. A diameter of the twisted carbon nanotube wire can be from about 0.5 nanometers to about 100 micrometers. Further, the twisted carbon nanotube wire can be treated with a volatile organic solvent after being twisted to bundle the adjacent paralleled carbon nanotubes together. The specific surface area of the twisted carbon nanotube wire will decrease, while the density and strength of the twisted carbon nanotube wire will increase.

The graphene layer 102 can also be a composite including a graphene matrix and non-graphene materials. The non-graphene materials can be carbon nanotube, silicon carbide, boron nitride, silicon nitride, silicon dioxide, diamond, amorphous carbon, metal carbides, metal oxides, or metal nitrides. The non-graphene materials can be deposited on the graphene layer 102 by CVD or physical vapor deposition (PVD), such as sputtering.

The graphene layer 102 can be used as a mask for growing the epitaxial layer 104. The mask is the patterned graphene layer 102 sheltering a part of the buffer layer 1041 and exposing another part of the buffer layer 1041. Thus, the epitaxial layer 104 can grow from the exposed buffer layer 1041. The graphene layer 102 can form a patterned mask on the buffer layer 1041 because the patterned graphene layer 102 defines a plurality of apertures 105. Compared to lithography or etching, the method of forming a patterned graphene layer 102 as mask is simple, low in cost, and may not pollute the substrate 100.

In step (40), the epitaxial layer 104 can be grown by a method such as molecular beam epitaxy, chemical beam epitaxy, reduced pressure epitaxy, low temperature epitaxy, select epitaxy, liquid phase deposition epitaxy, metal organic vapor phase epitaxy, ultra-high vacuum chemical vapor deposition, hydride vapor phase epitaxy, or MOCVD.

The epitaxial layer 104 is a single crystal layer grown on the buffer layer 1041 by epitaxy growth method. The material of the epitaxial layer 104 can be the same as or different from the material of the substrate 100. If the epitaxial layer 104 and the substrate 100 are the same material, the epitaxial layer 104 is called a homogeneous epitaxial layer. If the epitaxial layer 104 and the substrate 100 have different material, the epitaxial layer 104 is called a heteroepitaxial epitaxial layer. The material of the epitaxial layer 104 can be semiconductor, metal or alloy. The semiconductor can be Si, GaAs, GaN, GaSb, InN, InP, InAs, InSb, AlP, AlAs, AlSb, AN, GaP, SiC, SiGe, GaMnAs, GaAlAs, GaInAs, GaAlN, GaInN, AlInN, GaAsP, InGaN, AlGaInN, AlGaInP, GaP:Zn, or GaP:N. The metal can be aluminum, platinum, copper, or silver. The alloy can be MnGa, CoMnGa, or $Co_2MnGa$. The thickness of the epitaxial layer 104 can be prepared according to need. The thickness of the epitaxial layer 104 can be in a range from about 100 nanometers to about 500 micrometers. For example, the thickness of the epitaxial layer 104 can be about 200 nanometers, 500 nanometers, 1 micrometer, 2 micrometers, 5 micrometers, 10 micrometers, or 50 micrometers.

In one embodiment, the substrate 100 is sapphire, the GaN epitaxial layer 104 is grown on the sapphire substrate 100 by MOCVD method. The nitrogen source gas is high-purity $NH_3$, the Ga source gas is TMGa or TEGa, and the carrier gas is $H_2$. The growth condition of the GaN epitaxial layer 104 is similar as the growth of the low-temperature GaN buffer layer 1041. The sapphire substrate 100 with the graphene film 102 thereon is located into the reaction chamber and the carrier gas is introduced into the reaction chamber. The sapphire substrate 100 is heated to about 1100° C. to about 1200° C. to anneal for about 30 seconds to about 300 seconds. The temperature of the reaction chamber is maintained in a range from about 1000° C. to about 1100° C., and the Ga source gas and nitrogen source gas are introduced at the same time to grow the high quality epitaxial layer 104.

Figure 11:
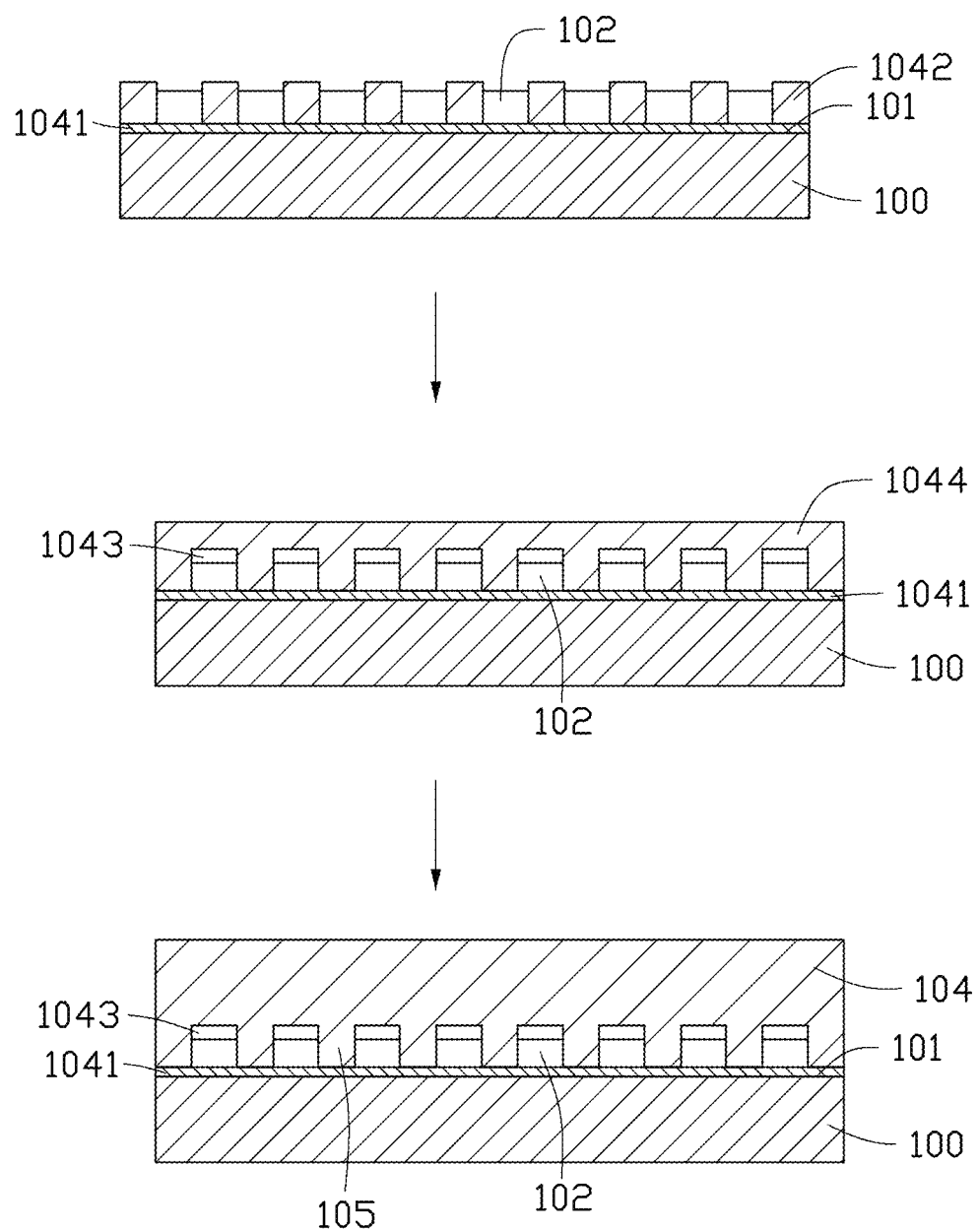
FIG. 11 is a process of growing an epitaxial layer on a substrate.

Referring to FIG. 11, specifically, step (40) includes the following substeps:

step (401), nucleating on the buffer layer 1041 and growing a plurality of epitaxial crystal grains 1042 along the direction substantially perpendicular to the buffer layer 1041;

step (402), forming a continuous epitaxial film 1044 by making the epitaxial crystal grains 1042 grow along the direction substantially parallel to the buffer layer 1041; and step (403), forming the epitaxial layer 104 by making the epitaxial film 1044 grow along the direction substantially perpendicular to the buffer layer 1041.

In step (401), the epitaxial crystal grains 1042 grow from the exposed part of the buffer layer 1041 and through the apertures 105. The process of the epitaxial crystal grains 1042 growing along the direction substantially perpendicular to the buffer layer 1041 is called vertical epitaxial growth.

In step (402), the epitaxial crystal grains 1042 are joined together to form an integral structure (the epitaxial film 1044) to cover the graphene layer 102. The epitaxial crystal grains 1042 grow and form a plurality of caves 103 to enclose the graphene layer 102. The inner wall of the caves 103 can be in contact with or spaced from the graphene layer 102, depending on whether the material of the epitaxial film 1044 and the graphene layer 102 have mutual infiltration. Thus, the epitaxial film 1044 defines a patterned depression on the surface adjacent to the buffer layer 1041. The patterned depression is related to the patterned graphene layer 102. If the graphene layer 102 includes a plurality of graphene strips located in parallel with each other and spaced from each other, the patterned depression is a plurality of parallel and spaced grooves. If the graphene layer 102 includes a plurality of graphene strips crossed or weaved together to form a net, the patterned depression is a groove network including a plurality of intersected grooves. The graphene layer 102 can prevent lattice dislocation between the epitaxial crystal grains 1042 and the substrate 100 from growing. The process of epitaxial crystal grains 1042 growing along the direction substantially parallel to the epitaxial growth surface 101 is called lateral epitaxial growth.

In step (403), the epitaxial layer 104 is obtained by growing for a long duration of time. Because the graphene layer 102 can prevent the lattice dislocation between the epitaxial crystal grains 1042 and the substrate 100 from growing in step (302), the epitaxial layer 104 has fewer defects therein.

In step (50), the substrate 100 can be removed by laser irradiation, corrosion, or thermal expansion and contraction. The method of removing the substrate 100 depends on the material of the buffer layer 1041, the material of the substrate 100, and the material of the epitaxial layer 104.

In one embodiment, the substrate 100 is sapphire, the buffer layer 1041 is a low-temperature GaN layer, and the epitaxial layer 104 is a high-temperature GaN layer. The substrate 100 is removed by laser irradiation and the step (50) includes the following substeps:

step (501), polishing and cleaning the surface of the substrate 100;

step (502), providing a laser beam to irradiate the substrate 100 and the epitaxial layer 104; and step (503), placing the epitaxial structure preform in a solution.

In step (501), the surface of the substrate 100 can be polished by a mechanical polishing or chemical polishing so the substrate 100 has a smooth surface to reduce the scattering in laser irradiation. The surface of the substrate 100 can be cleaned using hydrochloric acid or sulfuric acid to remove the metal impurities and/or oil dirt thereon.

In step (502), the epitaxial structure preform is placed on a flat support in a vacuum or protective gas to prevent the graphene layer 102 from oxidation. The protective gas can be nitrogen gas, helium gas, argon gas, or other inert gases.

The laser beam irradiates the polished surface of the substrate 100 substantially perpendicular to the polished surface. Thus, the laser beam can irradiate the interface between the substrate 100 and the epitaxial layer 104. The wavelength of the laser beam can be selected according to the material of the buffer layer 1041 and the substrate 100 so the energy of the laser beam is less than the band-gap energy of the substrate 100 and greater than the band-gap energy of the buffer layer 1041. Thus, the laser beam can get through the substrate 100 to arrive at the buffer layer 1041. The buffer layer 1041 can absorb the laser beam and be heated to decompose rapidly. In one embodiment, the buffer layer 1041 is a low-temperature GaN layer with a band-gap energy of 3.3 electron volts, the substrate 100 is sapphire with a band-gap energy of 9.9 electron volts, and the laser beam has a wavelength of 248 nanometers, an energy of 5 electron volts, an impulse duration from about 20 ns to about 40 ns, and an energy density from about 0.4 joules per square centimeter to about 0.6 joules per square centimeter. The shape of the laser spot is square with a side length of about 0.5 millimeters. The laser spot can move relative to the substrate 100 with a speed of about 0.5 millimeters per second. After absorption of the laser beam, the low-temperature GaN buffer layer 1041 can decompose to Ga and $N_2$. The substrate 100 will not be damaged because only a small amount of the laser beam is absorbed.

In step (503), the epitaxial structure preform is immersed in an acid solution to remove the Ga decomposed from the GaN buffer layer 1041 so the substrate 100 is separated from the epitaxial layer 104. The acid solution can be a hydrochloric acid, sulfuric acid, or nitric acid that can dissolve the Ga. Because the buffer layer 1041 is located between the graphene layer 102 and the substrate 100, the graphene layer 102 will remain on the epitaxial layer 104 after the substrate 100 is separated from the epitaxial layer 104. Because the buffer layer 1041 is decomposed by laser irradiation and removed by immersing in acid solution, the graphene layer 102 will remain in the caves 103. Furthermore, the $N_2$ decomposed from the GaN buffer layer 1041 will expand and separate the graphene layer 102 from the substrate 100 easily. Because the graphene layer 102 allows the epitaxial layer 104 and the buffer layer 1041 to have a relative small contacting surface, the substrate 100 can be separated from the epitaxial layer 104 easily and the damage on the epitaxial layer 104 will be reduced.

In one embodiment, the substrate 100 is SiC, the buffer layer 1041 is an AlN layer or a TiN layer, the epitaxial layer 104 is high-temperature GaN layer. The substrate 100 is removed by corroding the buffer layer 1041 in a corrosion solution. The corrosion solution can dissolve the buffer layer 1041 and the substrate 100 but cannot dissolve the epitaxial layer 104. The corrosion solution can be NaOH solution, KOH solution, or $NH_4OH$ solution. In one embodiment, the corrosion solution is NaOH solution with a mass concentration from about 30% to about 50%. The epitaxial structure preform is immersed in the NaOH solution for about 2 minutes to about 10 minutes. The NaOH solution enters the caves 103 to corrode the AlN buffer layer 1041 so the substrate 100 is separated from the epitaxial layer 104. If the buffer layer 1041 is a TiN layer, the corrosion solution can be a nitric acid.

Furthermore, the substrate 100 can also be dissolved by a corrosion solution directly. Thus, the step of growing the buffer layer 1041 can be omitted. Because the graphene layer 102 allows the epitaxial layer 104 and the buffer layer 1041 to have a relative small contacting surface and a plurality of caves 103 are located between the epitaxial layer 104 and the buffer layer 1041, the corrosion solution can spread on the buffer layer 1041 rapidly and uniformly. Thus, the substrate 100 can be separated from the epitaxial layer 104 easily and the damage on the epitaxial layer 104 can be reduced.

In one embodiment, the substrate 100 is sapphire, the buffer layer 1041 is a low-temperature GaN layer, and the epitaxial layer 104 is a high-temperature GaN layer. The substrate 100 is removed due to thermal expansion and contraction. The epitaxial structure preform is heated to a high temperature above 1000° C. and cooled to a low temperature below 1000° C. in a short time such as from 2 minutes to about 20 minutes. The substrate 100 is separated from the epitaxial layer 104 by cracking because of the thermal expansion mismatch between the substrate 100 and the epitaxial layer 104. The epitaxial structure preform can also be heated by applying an electrical current to the graphene layer 102. After the epitaxial structure preform cracks, the substrate 100 can be removed by moving along a direction parallel with the surface of the graphene layer 102 so the graphene layer 102 can remain on the epitaxial layer 104.

Figure 12:
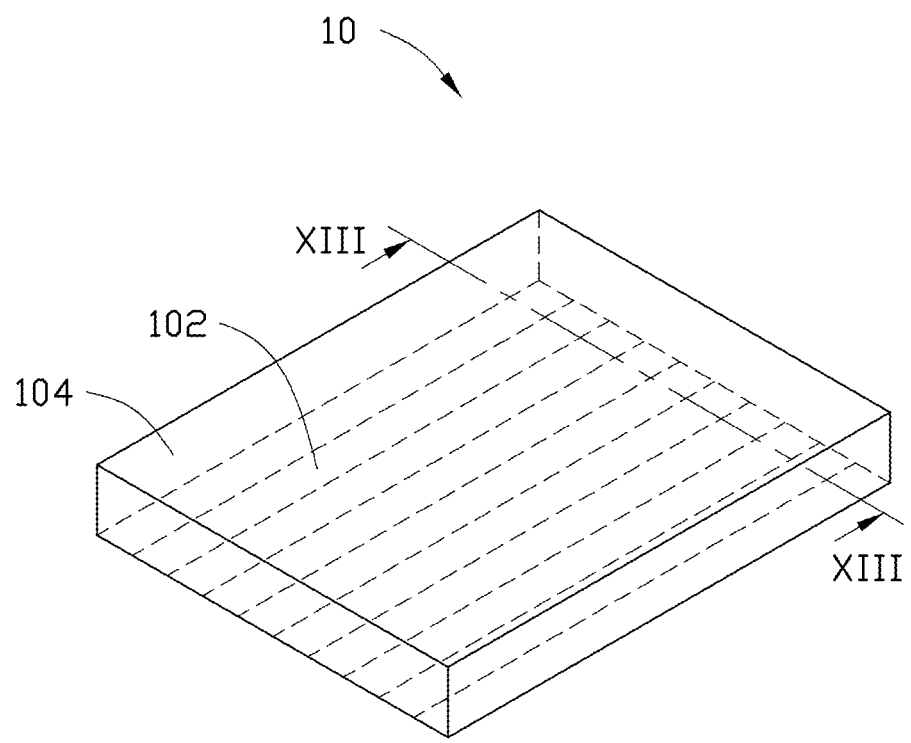
FIG. 12 is a schematic view of one embodiment of an epitaxial structure fabricated in the method of FIG. 1.
Figure 13:
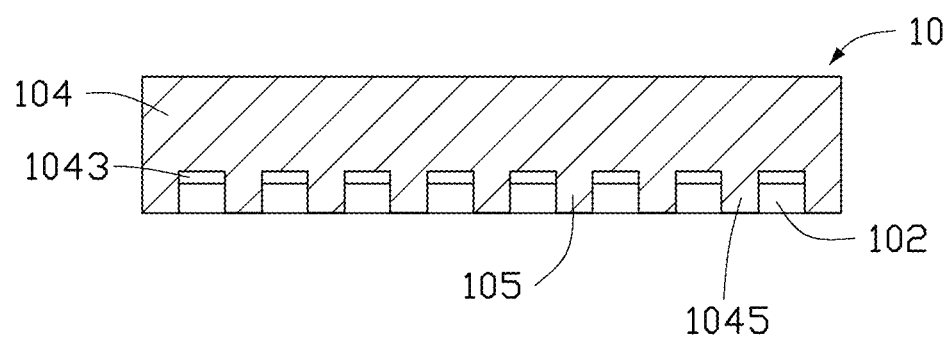
FIG. 13 is a schematic, cross-sectional view, along a line XIII-XIII of FIG. 12.

Referring to FIGS. 12 and 13, an epitaxial structure 10 in one embodiment includes an epitaxial layer 104 having a patterned surface, and a graphene layer 102 located on the patterned surface. The graphene layer 102 is patterned and defines a plurality of apertures 105 so a part of the epitaxial layer 104 protrudes from the apertures 105. The epitaxial layer 104 defines a plurality of micro-structures on the patterned surface. The graphene layer 102 is embedded in the micro-structures.

In one embodiment, the graphene layer 102 includes a plurality of graphene strips located in parallel with each other and spaced from each other. The plurality of micro-structures are a plurality of grooves 1043 and protrusions 1045 alternately located on the patterned surface of the epitaxial layer 104. Each of the plurality of graphene strips is located in one of the plurality of grooves 1043. Each of the plurality of protrusions 1045 extends through one of the plurality of apertures 105. The grooves 1043 are blind grooves and a part of the graphene layer 102 is exposed. When the epitaxial structure 10 is used to make a semiconductor device such as LED, the graphene layer 102 can be used as an electrode of the LED.

Figure 14:
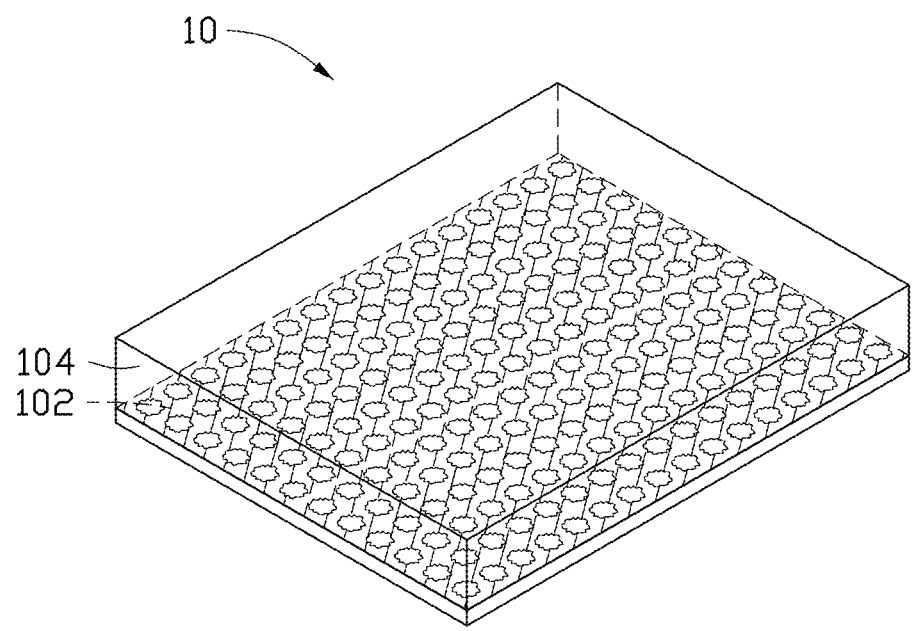
FIG. 14 is a schematic view of another embodiment of an epitaxial structure fabricated in the method of FIG. 1.
Figure 15:
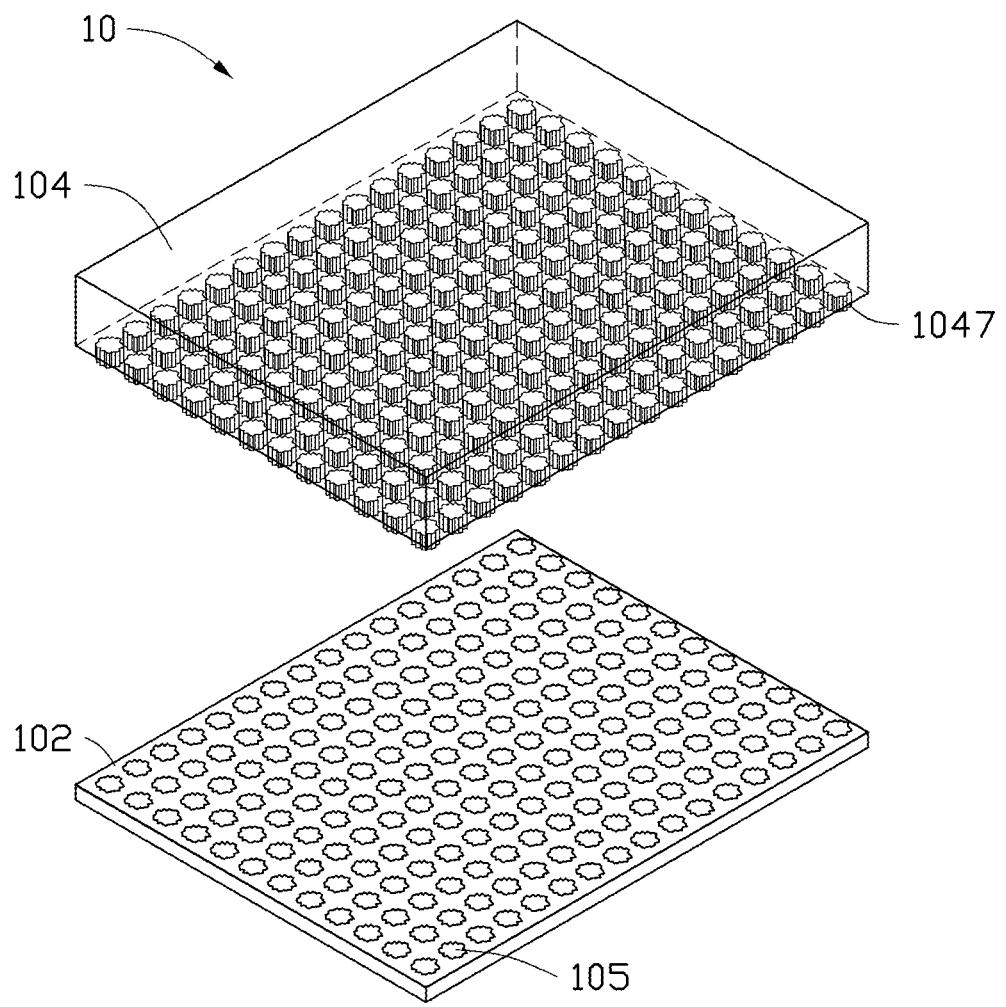
FIG. 15 is an exploded view of the epitaxial structure of FIG. 14.

Referring to FIGS. 14 and 15, in one embodiment, the graphene layer 102 is a graphene film having a plurality of apertures 105 which are hole shaped arranged in an array, and the epitaxial layer 104 defines a plurality of pillars 1407 with each extending through one of the hole shaped apertures 105.

Figure 16:
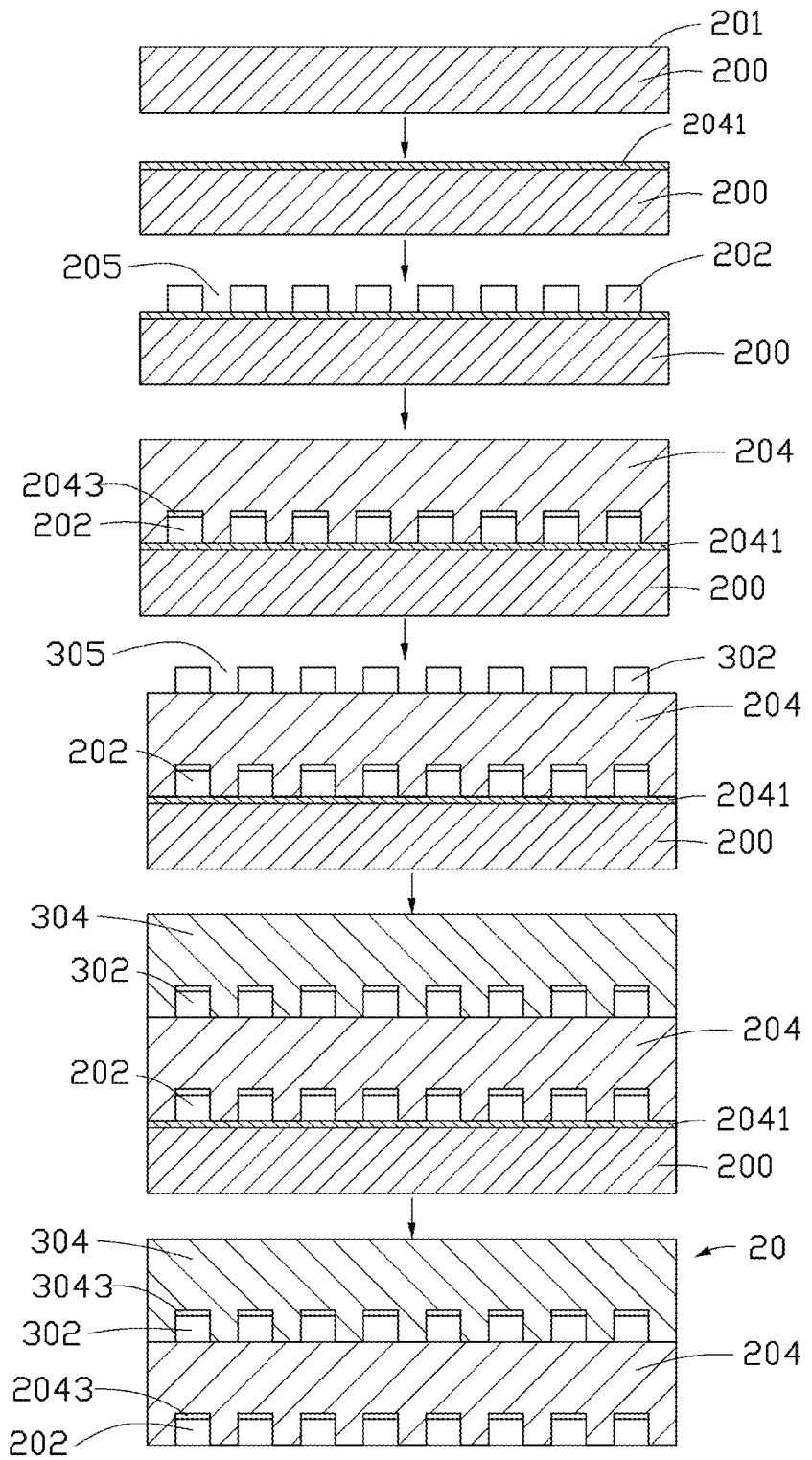
FIG. 16 is a flowchart of another embodiment of a method for making an epitaxial structure.

Referring to FIG. 16, a method for making an epitaxial structure 20 of one embodiment includes the following steps:

step (10), providing a substrate 200 having an epitaxial growth surface 201;

step (20), forming a buffer layer 2041 on the epitaxial growth surface 201;

step (30), placing a first graphene layer 202 on the buffer layer 2041;

step (40), epitaxially growing a first epitaxial layer 204 on the buffer layer 2041;

step (60), placing a second graphene layer 302 on the first epitaxial layer 204;

step (70), epitaxially growing a second epitaxial layer 304 on the first epitaxial layer 204; and step (50), removing the substrate 200.

The method for making an epitaxial structure 20 is similar to the method for making an epitaxial structure 10 described above except that it further includes a step (60) of placing a second graphene layer 302 on the first epitaxial layer 204 and a step (70) of epitaxially growing a second epitaxial layer 304 on the first epitaxial layer 204. The step (60) and (70) can be performed before or after step (50).

The first graphene layer 202 includes a plurality of first apertures 205. The second graphene layer 302 includes a plurality of second apertures 305. The second graphene layer 302 is sandwiched between the first epitaxial layer 204 and the second epitaxial layer 304. A plurality of grooves 3043 are defined on the second epitaxial layer 304. The second graphene layer 302 is embedded in the plurality of grooves 3043 of the second epitaxial layer 304. The material of the second epitaxial layer 304 can be same as the material of the first epitaxial layer 204.

It is to be understood that the above-described embodiments are intended to illustrate rather than limit the disclosure. Any elements described in accordance with any embodiments is understood that they can be used in addition or substituted in other embodiments. Embodiments can also be used together. Variations may be made to the embodiments without departing from the spirit of the disclosure. The above-described embodiments illustrate the scope of the disclosure but do not restrict the scope of the disclosure.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A method for making an epitaxial structure, the method comprising:
    growing a buffer layer on an epitaxial growth surface of a substrate;
    fabricating a continuous graphene layer on the buffer layer;
    obtaining a patterned graphene layer by patterning the continuous graphene layer, wherein the patterning the continuous graphene layer comprises:
        making a patterned metal titanium layer by depositing metal titanium on a patterned carbon nanotube structure;
        forming a patterned titanium dioxide layer by oxidizing the patterned metal titanium layer;
        contacting the patterned titanium dioxide layer with the continuous graphene layer;
        irradiating the patterned titanium dioxide layer with ultraviolet light; and
        removing the patterned titanium dioxide layer;
    epitaxially growing an epitaxial layer on the buffer layer to obtain an epitaxial structure preform; and
    removing the substrate.

2. The method of claim 1, the patterned graphene layer comprises a plurality of apertures to expose a part of the epitaxial growth surface, and the epitaxially growing comprises growing the epitaxial layer from the exposed part of the epitaxial growth surface and through the plurality of apertures.

3. The method of claim 2, wherein the plurality of apertures is hole shaped, and diameters of the plurality of apertures are in a range from about 10 nanometers to about 500 micrometers.

4. The method of claim 2, wherein a dutyfactor of the graphene layer is in a range from about 1:4 to about 4:1.

5. The method of claim 2, wherein the step of epitaxially growing the epitaxial layer on the epitaxial growth surface further comprises:
    nucleating on the buffer layer and growing a plurality of epitaxial crystal grains along a direction substantially perpendicular to the epitaxial growth surface;
    forming a continuous epitaxial film by growing the plurality of epitaxial crystal grains along a direction substantially parallel to the epitaxial growth surface; and
    forming the epitaxial layer by growing the continuous epitaxial film along the direction substantially perpendicular to the epitaxial growth surface.

6. The method of claim 5, further comprising growing the plurality of epitaxial crystal grains to form a plurality of caves enclosing the graphene layer so that the continuous epitaxial film defines a patterned depression on a surface adjacent to the buffer layer.

7. The method of claim 1, the fabrication of the graphene layer comprises:
    making a graphene film; and
    transferring the graphene film to the epitaxial growth surface of the substrate.

8. The method of claim 1, the fabrication of the graphene layer comprises:
    making a graphene suspension with graphene powders dispersed therein;
    forming a continuous graphene coating on the epitaxial growth surface of the substrate.

9. The method of claim 1, wherein the substrate is removed by laser irradiation, corrosion, or thermal expansion and contraction.

10. The method of claim 1, wherein the substrate is sapphire, the buffer layer is a low-temperature GaN layer, and the epitaxial layer is a high-temperature GaN layer; the step of removing the substrate comprises:
    polishing and cleaning a surface opposite to the epitaxial growth surface of the substrate;
    irradiating the substrate and the epitaxial layer using a laser beam; and
    placing the epitaxial structure preform in a solution.

11. The method of claim 1, wherein the substrate is SiC, the buffer layer is an AlN layer or a TiN layer, the epitaxial layer is a high-temperature GaN layer; the substrate is removed by corroding the buffer layer in a corrosion solution.

12. The method of claim 1, wherein the substrate is sapphire, the buffer layer is a low-temperature GaN layer, and the epitaxial layer is a high-temperature GaN layer; the substrate is removed by causing thermal expansion mismatches between the substrate and the epitaxial layer and cracking of the substrate.

13. The method of claim 1, wherein the patterned carbon nanotube structure comprises a plurality of carbon nanotube wires, and the plurality of carbon nanotube wires are crossed or woven together.

14. The method of claim 1, wherein the patterned carbon nanotube structure comprises a plurality of carbon nanotube wires, and the plurality of carbon nanotube wires are arranged in parallel and spaced from each other.

15. The method of claim 1, wherein the patterned carbon nanotube structure comprises a carbon nanotube film, and the carbon nanotube film comprises a plurality of successive and oriented carbon nanotubes joined end-to-end by van der Waals attractive force therebetween.

16. The method of claim 15, wherein the patterned carbon nanotube structure comprises two stacked carbon nanotube films, and an angle between aligned directions of the plurality of carbon nanotubes in the two stacked carbon nanotube films can range from about 0 degrees to about 90 degrees.

17. The method of claim 1, wherein the carbon nanotube structure is a free-standing structure.

18. The method of claim 1, wherein the oxidizing the patterned metal titanium layer comprises applying an electric current through the patterned carbon nanotube structure.

19. A method for making an epitaxial structure, the method comprising:
- providing a substrate having an epitaxial growth surface;
- making graphene powders on the epitaxial growth surface;
- epitaxially growing an epitaxial layer on the epitaxial growth surface; and
- removing the substrate.

* * * * *